US005486657A

United States Patent [19]
Bell et al.

[11] Patent Number: 5,486,657
[45] Date of Patent: Jan. 23, 1996

[54] BEVELED EDGE CIRCUIT BOARD WITH CHANNELED CONNECTOR PADS

[75] Inventors: James S. Bell, Cedar Park; Patricia L. Herman; Richard I. Phillips, both of Austin, all of Tex.

[73] Assignee: Dell USA, L.P., Austin, Tex.

[21] Appl. No.: 257,755

[22] Filed: Jun. 9, 1994

[51] Int. Cl.⁶ ........................................... H05K 1/02
[52] U.S. Cl. .................. 174/261; 174/260; 174/250; 361/767; 361/760; 439/83
[58] Field of Search .................... 174/250, 260, 174/261; 361/767, 771, 760, 772, 773; 439/83, 78; 29/840

[56] References Cited

U.S. PATENT DOCUMENTS

| | | | |
|---|---|---|---|
| 4,268,585 | 5/1981 | Daur et al. | 428/622 |
| 4,339,785 | 6/1982 | Ohsawa | 361/411 |
| 4,755,631 | 6/1988 | Churchwell et al. | 174/68.5 |
| 4,933,305 | 6/1990 | Kikkawa et al. | 437/211 |
| 5,329,068 | 6/1994 | Hirata et al. | 174/261 |

*Primary Examiner*—Leo P. Picard
*Assistant Examiner*—L. Thomas
*Attorney, Agent, or Firm*—Kevin L. Daffer; James Huffman

[57] ABSTRACT

A printed circuit board is provided having a beveled edge for ease of insertion into a receptor. The beveled edge is extended onto the solder mask to present a contiguous beveled surface. Moreover, the PCB includes bonding pads which can be surface mounted with pins extending from the receptor. Each bonding pad includes a forward portion and a rearward portion. The forward portion is covered with the solder mask layer to present a smooth surface channeled inward in a V-shaped configuration. The forward portion channels or directs the pin along a central axis near the apex of the V-shaped forward portion onto the upper surface of the bonding pad rearward portion. Accordingly, the pin is channeled to an area absent solder paste along the central axis such that during subsequent reflow operation the solder paste is reliably extended over and around the centrally placed pin.

16 Claims, 5 Drawing Sheets

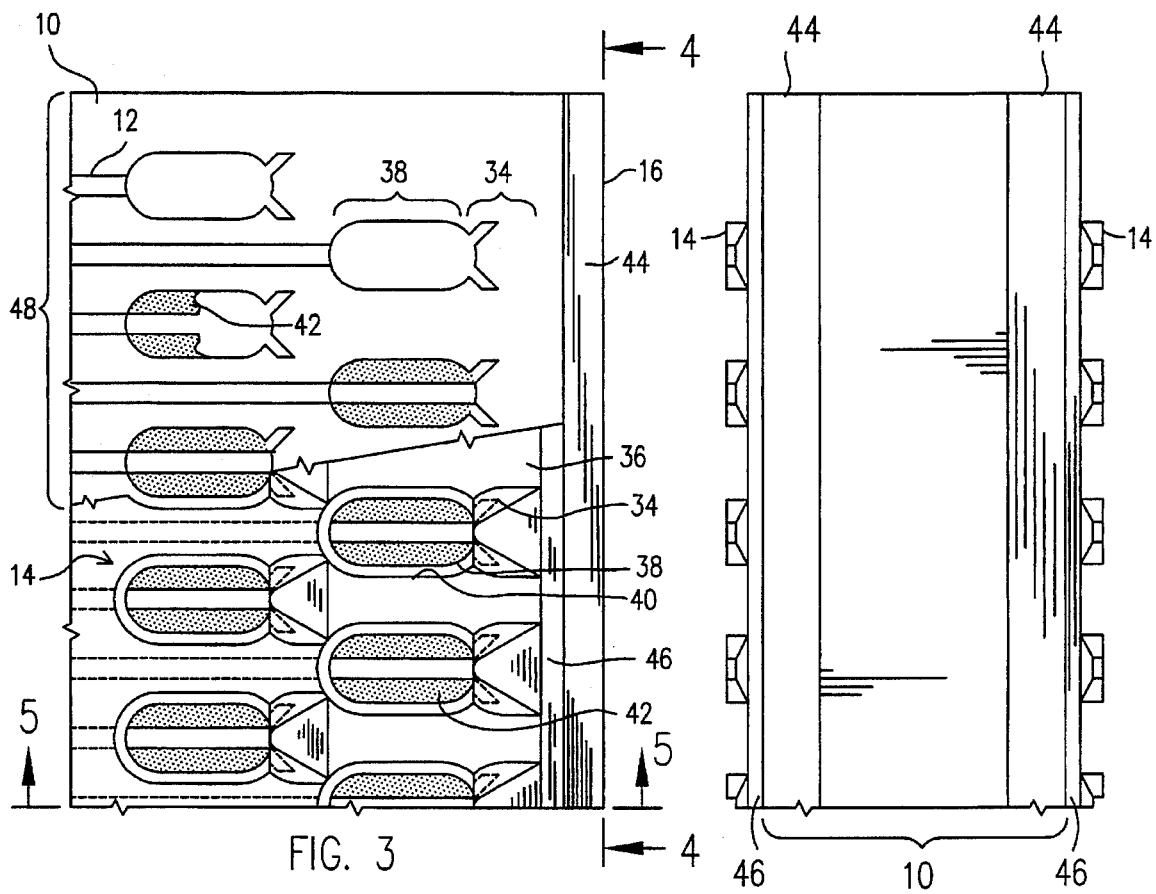
FIG. 3
FIG. 4
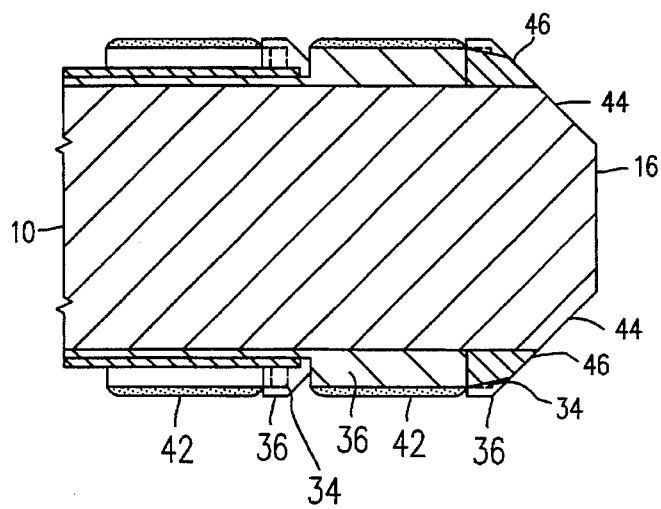
FIG. 5

5,486,657

BEVELED EDGE CIRCUIT BOARD WITH CHANNELED CONNECTOR PADS

BACKGROUND OF THE INVENTION

1. Field of the Invention

This invention relates to a printed circuit board (PCB) and more particularly to a PCB bonding pad which is partially covered with a solder mask layer for directing a surface mount pin upon the bonding pad from a lateral direction.

2. Background of the Relevant Art

PCBs or printed wiring boards (PWBs) are rigid or flexible single, double or multi-layered boards having printed conductors placed upon or within the board material. A PCB is designed to receive separately manufactured electrical components and to interconnect those components in an overall circuit structure. The components or parts comprise integrated or discrete circuits well-known in the semiconductor art.

PCBs include numerous conductors arranged within a layer or layers extending across the PCB insulated material. Most industrial and commercial PCBs are manufactured from rigid copper-clad, epoxy-impregnated glass fiber laminate. The printed conductors can be selectively formed by a subtractive or additive process. Either process usually includes tin, lead-tin and/or gold plating steps. Formed on one or both surfaces near an edge of the PCB is a row of edge-board contacts (often referred to as "fingers"). The fingers are formed at the same time as the printed conductors and component mounting pads and can be gold plated to permit mating and removal of the PCB into and from a receptor without damaging the contact material. The fingers are spaced from one another and slightly elevated from the upper surface of the PCB. Each finger is configured to receive a compliant pin arranged within the receptor. Flexure of the pin allows frictional engagement and electrical contact between the pin and the contact. Many receptors include a plurality of pins arranged in two rows spaced from one another. The spaced rows define a slot into which the edge of the PC board containing fingers can be frictionally inserted.

There are many types of receptors. A receptor can be, for example, a back plane connector on a mother board or a cable connector of flexible conductors. As stated above, many receptors allow non-permanent engagement and connection with a PCB edge. Other receptors are specifically designed to permit permanent connection between each of the compliant pins and the fingers. Regardless of whether permanent connection or non-permanent connection is desired, it is critical that the pins make electrical contact with respective fingers. The pins must therefore be directed or channeled to their respective positions on the upper surface of the fingers before electrical conductivity can be achieved and/or before permanent connection can be achieved.

A receptor which achieves permanent connection to fingers is generally configured having elongated compliant pins spaced from one another and extending in at least one row. The distal end (or "toe") of each pin extends laterally from the edge of the card, flexes upward and onto the surface of the card toward a forward facing edge of the finger. The fingers, extending above the PCB surface, forces further upward compliance of the pin such that the toe of each pin resides upon the finger tipper surface. Upward movement of the pins onto the PCB edge and subsequently upon the finger upper surface can adversely affect the alignment of one or more pins within the row of pins. Thus, a concern of PCB manufacturers is the possibility of adverse displacement of the compliant pin during times in which the PCB edge enters the slot formed between rows of pins. Significant lateral displacement can cause the pins to reside upon insulative material between fingers rather than on the finger itself. Moreover, upward displacement at abrupt surfaces at the PCB edge can bend or possibly break the pin such that it is incapable of contacting the finger.

If the pin is to be permanently affixed to a finger through, for example, surface mount soldering, then it is important that proper solder connection exists between the pin and respective finger. Permanent surface mount technology (SMT) employs the fingers as bond sites and therefore a more accurate terminology would be to indicate the fingers as "bonding pads". Bonding pads near the PCB edge serve a dissimilar function than component mounting pads placed elsewhere on the PCB. Absent proper placement of pins upon respective bonding pads, subsequent soldering steps (reflow or wave) may not provide adequate connectivity.

It is therefore important that the edge of a PCB be configured to provide channeling of each pin to the center of each respective bonding pad. Channeling must occur with minimal upward and lateral disruption during times in which the PCB edge is forced within the receptor slot. Provided they are properly placed, each pin can then be surface mounted to the pads with a more reliable outcome.

SUMMARY OF THE INVENTION

The problems outlined above are in large part solved by the PCB and channeled bonding pads of the present invention. That is, the PCB hereof utilizes a beveled edge which allows the compliant pins to be gradually raised to the upper surface of the PCB with minimal risk of bending or displacing the pins during placement. The PCB further includes a layer of solder mask which is beveled at the same angle as the PCB edge to allow continual upper movement of each pin not only onto the PCB but onto the upper surface of the solder mask layer. Even still further, the PCB includes one or more bonding pads arranged in at least one row proximate to the beveled edge of the solder mask and PCB. Each bonding pad includes a forward and a rearward portion. The forward portion is covered with the layer of solder mask and provides a smoothing surface which extends from the beveled edge of the solder mask, over the forward portion just prior to the rearward portion. The PCB hereof thereby provides an upper surface which allows gradual upward movement of each pin from the edge of the PCB to the rearward portion of respective bonding pads. Further, each pin is directed by a unique configuration of the forward portion to a central position upon the rearward portion. The rearward portion comprises a layer of solder which adheres to and electrically contacts with the placed pin during reflow operation.

Broadly speaking, the present invention contemplates a PCB. The PCB comprises a plurality of bonding pads spaced from each other in a row along one side of the PCB. The row is parallel to one edge of the PCB. A layer of solder mask surrounds a rearward portion of the bonding pads and covers the remaining, forward portion of the bonding pads. The layer of solder mask is beveled at the edge of the printed circuit board, and the covered portion of each bonding pad faces the beveled layer of solder mask.

The rearward portion can be oval-shaped having a central axis which dissects and is coplanar with the rearward portion. The central axis defines a vertex point at the side of or inside the periphery of the rearward portion from which a pair of protrusions diverge therefrom to form a V-shaped forward portion. The opening of the V-shaped forward portion is directed toward the beveled layer of solder mask at the PCB edge.

The edge of the PCB is beveled at an angle substantially equal to the angle in which the layer of solder mask is beveled. The beveled PCB and beveled solder mask are aligned with one another to present a continuous beveled surface adapted for insertion into a female receptor containing at least one and possibly two parallel-spaced rows of compliant pins. The edge of the PCB and the edge of the solder mask is beveled at an acute angle relative to the planar surface of the PCB. The forward end of each bonding pad faces the beveled edge of the printed circuit board, and the rearward ends of each bonding pad is placed aft the forward end. The upper surface of the beveled PCB, the beveled solder mask, and the solder mask covered forward end extend at a substantially continuous acute angle from the edge of the printed circuit board to the rearward end upper surface.

The present invention further contemplates a bonding pad. The bonding pad comprises a forward portion extending coplanar with a rearward portion. The forward portion is V-shaped having a pair of protrusions extending coplanar with the forward and rearward portion in a divergent pattern from a vertex point at a forward-facing side of the rearward portion. A solder mask material is placed over the forward portion to present an upper smoothing surface at a non-abrupt angle. The upper smoothing surface is adapted to receive a laterally directed conductive pin, and to channel the conductive pin in an upward direction toward the vertex and upon the rearward portion. As defined herein, "non-abrupt angle" comprises a constant or slightly variable angle relative to the upper planar surface (or lower planar surface) of the PCB. A constant or variable angle is defined as an acute angle greater than 0° and less than 90° relative to the PCB planar surface. Preferably, the non-abrupt angle is an angle approximately equal to 45° or is a variable angle which can vary from 10° to 80°, and that the rate of variance is less than 5° per mil of distance.

BRIEF DESCRIPTION OF THE DRAWINGS

Other objects and advantages of the invention will become apparent upon reading the following detailed description and upon reference to the accompanying drawings in which:

FIG. 3 is an enlarged, partial breakaway view of the PCB edge of FIG. 1;

FIG. 4 is an end view of the PCB edge along plane 4—4 of FIG. 3;

FIG. 5 is a side view of the PCB edge along plane 5—5 of FIG. 3;

Figure 2:
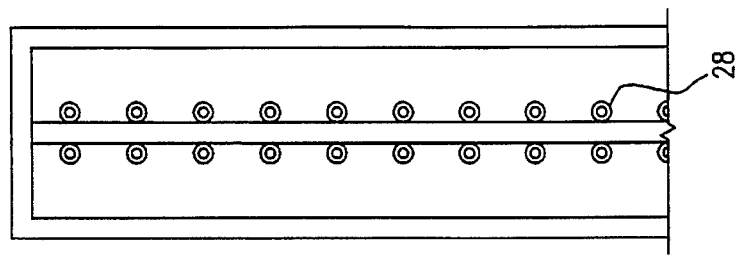
FIG. 2 is an end view of the receptor along plane 2—2 of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 1:
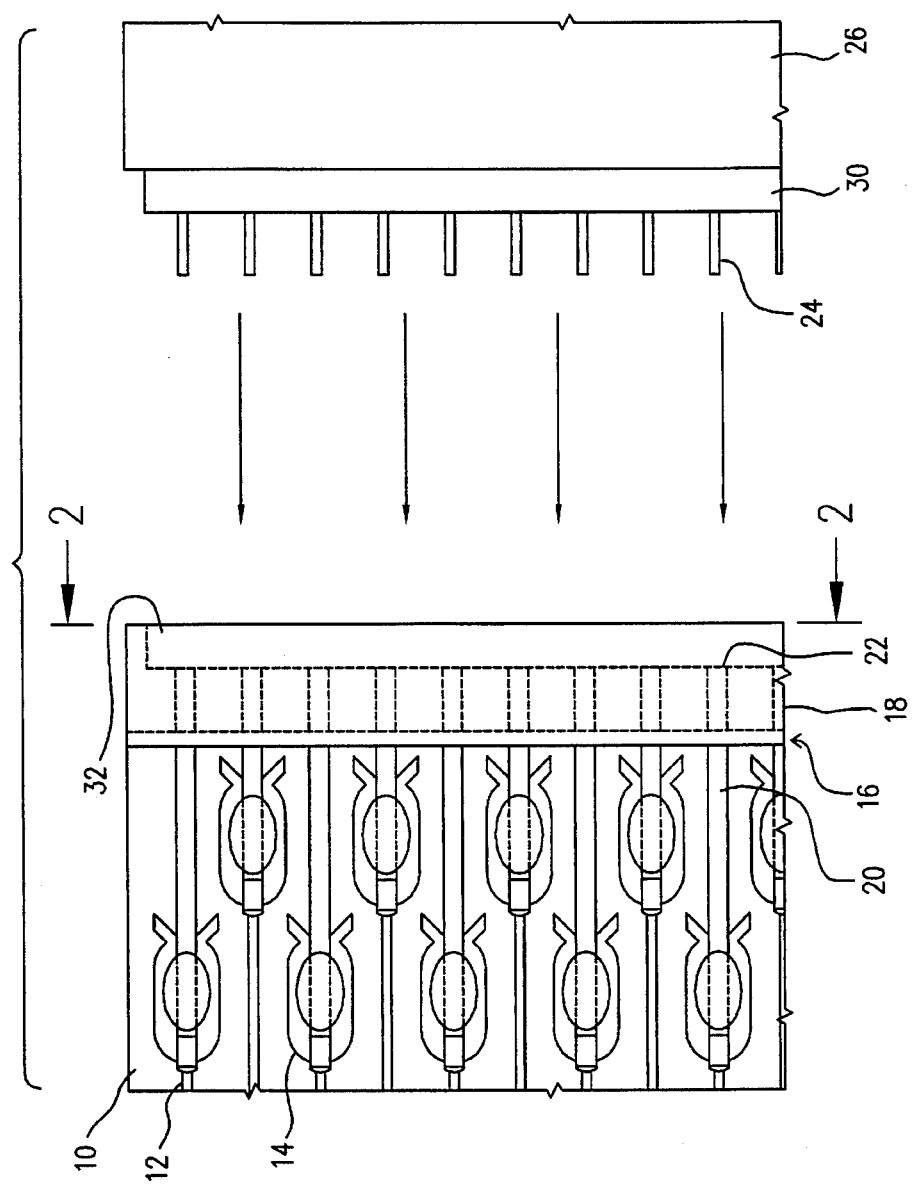
FIG. 1 is a partial top view of a PCB edge with a receptor coupled to the PCB edge and a remote plug-in unit connectable to the receptor according to the present invention.

Turning now to the drawings, FIG. 1 illustrates a partial top view of a printed circuit board (PCB) 10. PCB 10 includes a plurality of printed conductors 12 extending across at least one surface of PCB 10. A select group of conductors 12 terminate at fingers (bonding pads) 14 arranged near the edge 16 of PCB 10. Bonding pads 14 are spaced from each other in at least one row extending parallel to edge 16.

The edge 16 of PCB 10 is configured to extend into a slot or groove within a receptor 18. Receptor 18 includes a plurality of receptor pins 20 which extend from receptor 18 in registry with pads 14. Pins 20 are arranged at a pitch and length necessary to contact the upper surface of bonding pads 14 when edge 16 is inserted into receptor 18.

Ends 22 of pins 20, configured within receptor 18 are adapted to frictionally receive plug-in pins 24 connected to plug-in unit 26. Pins 24 can be of any configuration which allows temporary electrical connection to pins 20, a suitable configuration is shown in FIG. 2 in which plug-in pins 24 extend into sockets 28 arranged at ends 22 of pins 20. When pins 24 mate with pins 20, portion 30 of plug-in unit 26 mates within recess 32 of receptor 18. Receptor 18 is therefore used as a docking connector which can receive a remote plug-in unit 26 on a temporary basis. Receptor 18 in its preferred form, is permanently affixed to PCB 10 using surface mount techniques after edge 16 is plugged into receptor 18.

Referring now to FIG. 3, an enlarged, partial breakaway view of PCB 10 is shown. Specifically, PCB 10 is shown having a forward portion 34 of bonding pads 14 covered with a layer of solder mask material 36. A rearward portion 38 of bonding pads 14 does not have overlying solder mask layer 36. Instead, a window 40 is formed through solder mask layer 36 to expose underlying rearward portion 38. Thus, solder mask layer covers the forward portion and surrounds the rearward portion, the exposed rearward portion can then be selectively covered with a film or paste of solder 42.

Edge 16 of PCB 10 is beveled at an acute angle relative to the upper surface of PCB 10 in location 44. Solder mask layer 36 is also beveled at an acute angle relative to the PCB upper surface and forms a continuous surface 46 from surface 44. Beveled PCB 44, beveled solder mask 46, and the steps necessary to form the beveled areas and selectively place the solder mask 36 is described below in reference to FIG. 9. At present, however, it is understood that solder mask 36 is a coating material which is applied before pins 20 are soldered to pads 14. Thus, solder mask material is capable of withstanding the temperature of soldering and its associated chemical and mechanical intrusions. Moreover, the solder mask material does not allow adherence of solder thereto and is therefore useful in protecting the assembly from solder bridges in areas where spacing between solder points is very small. Thus, the main objective of solder mask layer 36 is to expose certain areas underlying windows 40 while covering all other areas in order to ensure accurate placement of solder only in uncovered areas. It is preferred that a 0.003 inch radial clearance exists between the outer periphery of bonding pads 14 and the inside edge, or window 40, of solder mask 36. Application of solder mask layer 36, including procedures used to selectively place the solder mask, is outlined below in reference to FIG. 9.

For ease of understanding the application of solder mask in relation to forward portion 34, solder mask 36 is broken away in area 48, shown in FIG. 3. Illustrative breakaway removal of solder mask 48 allows a clearer showing of bonding pads 14, comprising forward portion 34 and rearward portion 38. Rearward portion 38 is connected to the terminal ends of printed conductors 12. Shown in partial cutaway is solder paste 42 placed upon portions of the upper surface of rearward portion 38. Solder paste 42 consists of a paste flux impregnated with small nodules of solder. Solvents are added to improve flow characteristics during the application process and to control the working life of the paste. Tin-lead or tin-lead-silver solders with RMA-grade fluxes are generally specified. Pastes for surface mount applications must meet the criteria of viscosity and particle size suitable for the intended method of application. Moreover, the paste must be formulated so as to resist the tendency to form loose solder particles, called "solder balls" after reflow. The solder must reflow at temperatures compatible with the materials to be joined and the flux residue must be removable in standard solvent or by aqueous cleaning processes. The process for applying solder paste to PCB 10 is described below in reference to FIG. 9. Generally speaking, solder paste is applied selectively using a screen printing or automated pressurized needle dispensing process similar to the imaging of printed conductors 12 and bonding pads 14.

FIG. 4 illustrates an end view of PCB 10 along plane 4—4 of FIG. 3. In particular, FIG. 4 shows bonding pads 14 arranged on at least one side of PCB 10. In area 44 PCB 10 is beveled, and in area 46 solder mask layer 36 is beveled. Beveled portions 44 and 46 at the edge of PCB 10 allow a more directed or channeled insertion of PCB 10 into a groove or slit within receptor 18.

FIG. 5 illustrates a side view of PCB 10 along plane 5—5 of FIG. 3. Beveled areas 44 and 46 are shown contiguous with one another and at an acute angle relative to the planar surface of PCB 10. Solder mask layer 36 is shown placed over forward portion 34 and not over rearward portion 38. Instead of solder mask 36, solder paste 42 is placed upon the upper surface of rearward portion 38. FIG. 5 more clearly illustrates the duplicative configuration of solder mask and solder paste placed on forward and rearward portions, respectively, of each bonding pad, whether or not the bonding pad is in the first or second row. It is understood, however, that in many instances more than one row of bonding pads may be necessary depending upon the density of connections between PCB 10 and receptor 18. FIGS. 1, 3 and 5 illustrate two rows of bonding pads. It is readily apparent, however, that more than two or less than two rows is applicable depending upon the design requirements.

Figure 6:
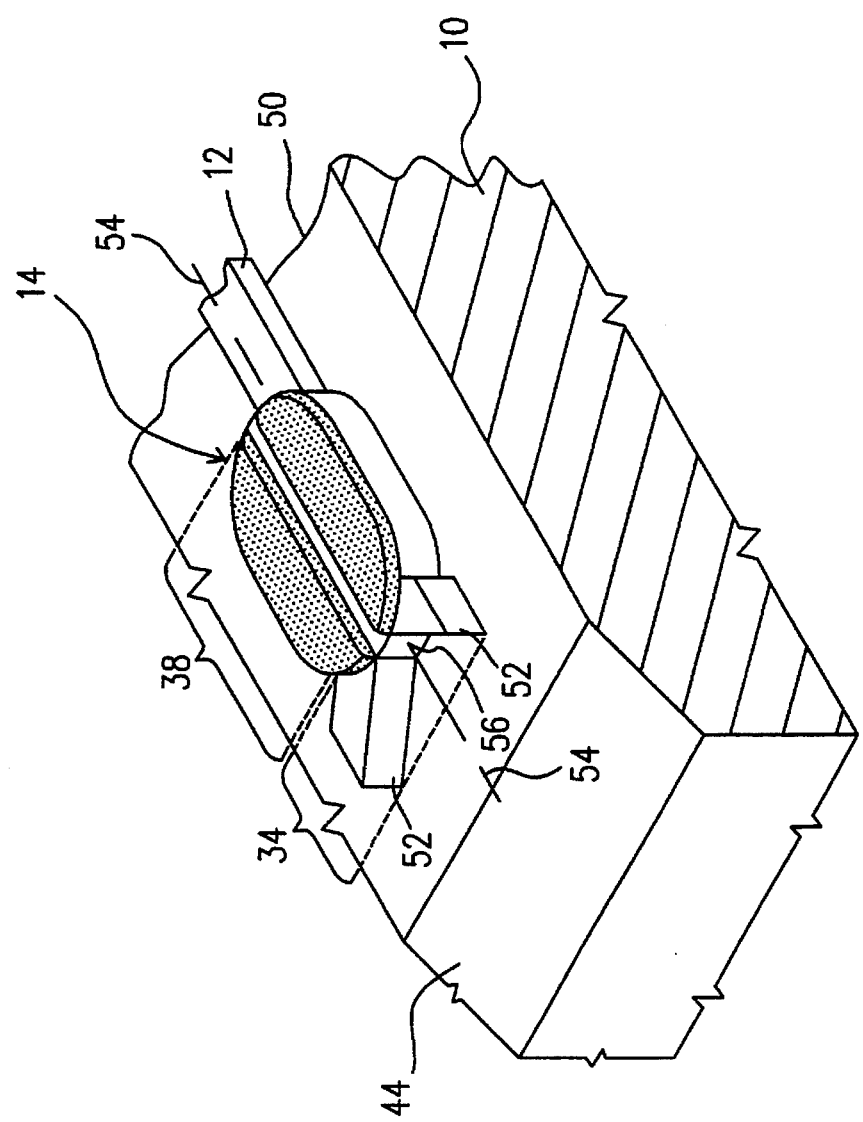
FIG. 6 is a perspective view of a bonding pad near the PCB edge according to the present invention.

Referring now to FIG. 6, a perspective view of bonding pads 14 absent an overlying solder mask layer is shown. Forward portion 34 is more clearly illustrated as being coplanar with rearward portion 38 upon the upper surface 50 of PCB 10. Rearward portion 38 is connected at a rearward-facing side to a printed conductor 12. Connected and extending from the forward-facing side of rearward portion 38 is a forward portion 34. Forward portion 34 includes a pair of protrusions 52. Protrusions 52 can be of any shape, provided they extend in a diverging fashion outward of central axis 54. Protrusions 52 extend in directions which intersect central axis 54 at a vertex point 56 upon central axis 54. Vertex point 56 is preferably at or slightly inside of the forward-facing side of rearward portion 38. Preferably, vertex point 56 is inside of (within) the outer periphery of rearward portion 38 so as to allow a space or gap between protrusions 56 in the area in which they connect with rearward portion 38. The gap allows subsequent placed mask layer 38 to form a smooth channel facing inward toward central axis 54.

Figure 7:
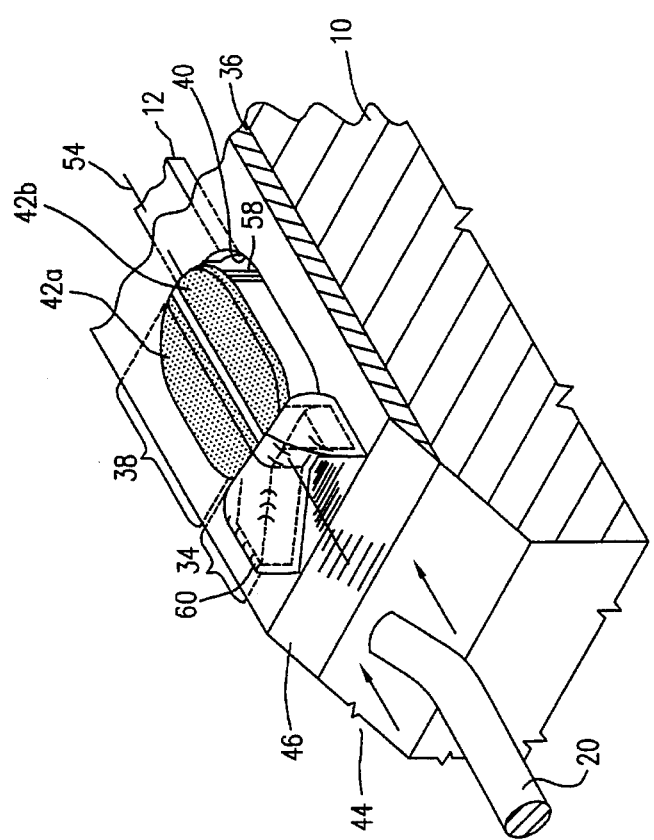
FIG. 7 is a perspective view of the bonding pad partially covered with a solder mask layer and configured to receive a receptor pin according to the present invention.

Turning now to FIG. 7, bonding pad is shown having forward portion 34 covered with solder mask layer 36. Further, printed conductor 12 is covered with solder mask layer 36, wherein the only exposed region is that of rearward portion 38. Solder mask window 40 is spaced a distance from the outer edge 58 of rearward portion 38. Solder mask 36 is therefore applied after bonding pads 14 and printed conductor 12 are lithography formed. The technique used to selectively place solder mask layer 36 is described below. Fine-line geometries can be achieved in order to ensure the forward portion and not the rearward portion is covered. Solder mask upper surface 60 upon forward portion 34 is slightly planarized to present a smoothing surface directed inward to central axis 54. The combination of beveled surfaces 44 and 46 as well as tapered surface 60 allows gradual upward movement of pin 20 from a non-engaged position to a position upon the upper surface of rearward portion 38. By avoiding abrupt walls of perpendicular orientation to the upper surface of PCB 10, pin 20 is allowed to gradually flex in a manner which eliminates or substantially minimizes bending or breakage of the pin. Still further, the V-channeled configuration of surface 60 allows channeling or directing of pin 20 along central axis 54. Any mis-orientation of pin 20 can be re-directed to the central axis to ensure its proper placement at the center of rearward portion 38 between selectively placed areas of solder paste 42. Accordingly, pin 20 is channeled between solder paste areas 42a and 42b along a groove void of solder paste. By selectively placing the solder paste away from the area in which pin 20 is directed, insertion of pin 20 will not cause "scooping" of paste at the forward end of the pin as it is laterally directed across rearward portion 38. Prevention of scooping helps reduce the possibility of shorting to adjacent bonding pads and increases the reliability of the reflow solder joint.

Figure 8:
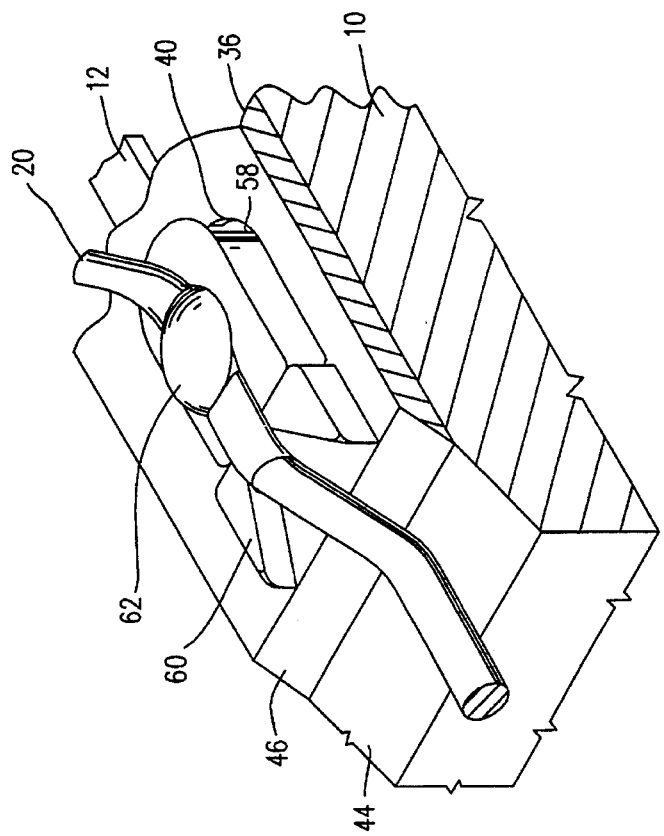
FIG. 8 is perspective view of a receptor pin in place and solder bonded to the bonding pad.

Turning now to FIG. 8, pin 20 is shown residing upon rearward portion 38 after PCB 10 is fully inserted into receptor 18. Benefitting from the orientation of regions 44, 46 and 60, pin 20 resides along central axis 54 with minimal risk of bending or breaking pin 20 during placement. After pin 20 is placed, PCB 10 is heated to a temperature sufficient to reflow solder paste 42 to the juncture between and around pin 20 and rearward portion 38. Once heated, solder paste forms a ball 62 of hardened conductive material around pin 20, as shown.

Figure 9:
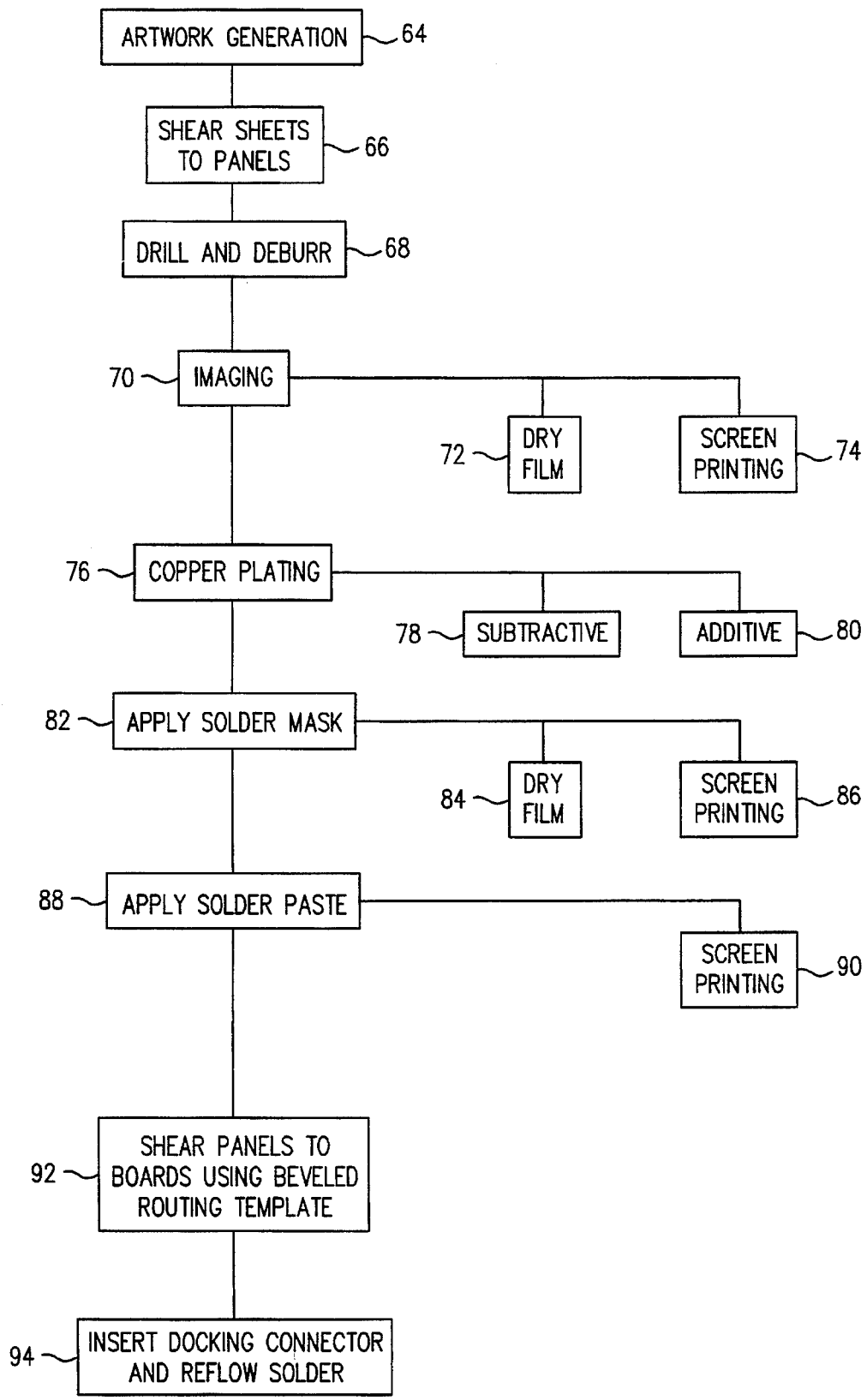
FIG. 9 is a flow diagram of steps used to make surface mount receptor/docking connection to a PCB edge according to the present invention.

Formation of bonding pads 14, solder mask 36, beveled areas 44 and 46 and solder paste 42 upon the upper topography is described in the flow diagram of FIG. 9. Beginning with an insulative material having epoxy, glass and/or polyamide species, printed conductors, including bonding pads, are lithography formed upon the insulative material. Printed conductors 12 and bonding pads 14 are laid out in a pictorial representation of their exact location on the insulative substrate. The pictorial representation is generally referred to as artwork, and artwork can include numerous layers. One or more layers or printed conductors can be included in each pictorial representation, wherein the upper layer is generally reserved for the bonding pad configuration. Another layer can be dedicated to solder mask, while a further layer can be used for nomenclature.

After the artwork is generated at step 64, it is reduced to electric media necessary to reproduce the artwork to a "step-and-repeat" image. Before the image is developed upon the insulative substrate, sheets of substrate material are sheared to workable panel sizes in step 66. Each panel is drilled, if desired, and the resulting holes can subsequently be plated or left non-plated depending upon the desired technology or application. Drilling of holes often leaves burrs at the edges of each hole which must subsequently be removed by a deburr operation. Drill and deburr operations are shown in step 68.

After each panel is sufficiently drilled and deburred, it is imaged with the generated artwork. Imaging involves the transfer of the artwork circuitry onto the panel at step 70 using either a dry film process 72 or screen printing process 74. A photosensitive dry film resist can be laminated onto the surface of the panels, wherein the panels are then exposed to ultraviolet light. When developed, the printed conductors and bonding pads are exposed copper; the rest of the panel is polymerized resist. Similar to dry film, screen printing involves a resist placed over the PCB prior to exposure of ultraviolet light. Instead of a dry film, screen printing utilizes liquid resist forced through openings within a screen onto the PCB.

Once the resist is exposed and certain areas are polymerized, the non-polymerized resist is removed leaving windows to underlying copper. The copper must be plated at step 76 by either a subtractive process 78 or an additive process 80. Using either process, additional copper is applied to the exposed copper areas followed by a tin-lead plating. The tin-lead plating of approximately 60 to 63 percent tin and 37 to 40 percent lead serves to resist subsequent etching processes and provides a solder base on bonding pads which can be later reflowed.

In all areas except for the bonding pad areas, and particularly the rearward portion 38, solder mask layer 36 is placed in step 82. Solder mask is placed in imaging steps using dry and screen printing processes 84 and 86, respectively, similar to steps 72 and 74, respectively. Solder mask functions to protect specific areas of PCB 10 from additional solder during the wave solder operations on the assembly line. In addition, it prevents solder from bridging to adjacent circuits during wave solder or reflow operations. Still further, solder mask can protect the PCB from a certain degree of moisture retention.

After the solder mask layer is deposited, a solder paste is applied according to step 88. The paste of solder is selected as sufficient viscosity and particle size to allow screen printing of the solder paste at step 90 upon rearward portions 38. Screen printing step 90 allows windows to be opened in areas 42a and 42b through the resist pattern, allowing solder paste to be deposited into those window openings. After solder paste is applied, the panels can be sheared to specific PCB sizes using a beveled router directed along a routing template at step 92. The beveled PCB and overlying beveled solder mask layer can then be inserted into a receptor or docking connector having numerous pins extending laterally therefrom. Once the PCB is firmly inserted and seated within the receptor, the PCB can be heated during a surface mount reflow operation, as shown by process step 94. Reflow of the solder paste onto the pins provides a secure electrical connection of the PCB to the receptor thereby allowing plug-in units to be docked into the receptor as shown in FIG. 1.

It will be appreciated to those skilled in the art having the benefit of this disclosure that this invention is capable of applications with numerous types of PCBs and with numerous types of overlying electrical components. Furthermore, it is to be understood that the form of the invention shown and described is to be taken as exemplary presently preferred embodiments. Various modifications and changes may be made without departing from the spirit and scope of the invention as set forth in the claims. It is intended that the following claims be interpreted to embrace all such modifications and changes and, accordingly, the specification and drawings are to be regarded in an illustrative rather than a restrictive sense.

What is claimed is:

1. A printed circuit board, comprising:
   a plurality of bonding pads spaced from each other in a row along one side of a printed circuit board, wherein said row is parallel to one edge of said printed circuit board; and
   a layer of solder mask surrounding a rearward portion of said bonding pads and covering the remaining, forward portion of said bonding pads, wherein the layer of solder mask is beveled at the edge of said printed circuit board, and wherein the covered portion of each said bonding pad is arranged adjacent said beveled layer of solder mask.

2. The printed circuit board as recited in claim 1, wherein said rearward portion is oval-shaped having a central axis which dissects and is coplanar with said rearward portion.

3. The printed circuit board as recited in claim 2, wherein said central axis defines a vertex point at the side of said rearward portion from which a pair of protrusions diverge therefrom to form a V-shaped said forward portion.

4. The printed circuit board as recited in claim 3, wherein the opening of the V-shaped said forward portion is directed toward said beveled layer of solder mask.

5. The printed circuit board as recited in claim 1, further comprising a layer of solder paste selectively placed along the upper surface of said rearward portion.

6. The printed circuit board as recited in claim 1, wherein the edge of said printed circuit board is beveled at an angle substantially equal to the angle at which the layer of solder mask is beveled, whereby beveled said printed circuit board and beveled said solder mask are aligned with one another to present a continuous beveled surface adapted for insertion into a female receptor.

7. A printed circuit board, comprising:
   a printed circuit board having a planar surface and one edge of the printed circuit board beveled at an acute angle relative to said planar surface;
   a plurality of bonding pads spaced from each other along said printed circuit board beveled edge, wherein each said bonding pad includes a forward end adjacent to and facing the beveled edge of said printed circuit board and a rearward end placed aft said forward end; and
   a layer of solder mask covering said forward end at an acute angle relative to said planar surface, and wherein the layer of solder mask is beveled proximate to the beveled edge of said printed circuit board at an acute angle relative to said planar surface, whereby an upper surface of the beveled said printed circuit board, the beveled said solder mask, and the solder mask covered said forward end extend at a substantially continuous acute angle from the edge of the printed circuit board to an upper surface of the rearward end of said bonding pads.

8. The printed circuit board as recited in claim 7, wherein the upper surface of the beveled said printed circuit board, the beveled said solder mask, and the solder mask covered said forward end is adapted to receive one end of an elongated pin extending from a receptor aligned with the edge of said printed circuit board.

9. The printed circuit board as recited in claim 7, wherein said elongated pin is in alignment with and is adapted for extending over a respective one of said plurality of bonding pads.

10. The printed circuit board as recited in claim 7, wherein the forward end of each said bonding is pad V-shaped having a pair of protrusions extending along said planar surface in a divergent pattern from an apex point at a forward-facing side of said rearward end.

11. The printed circuit board as recited in claim 7, wherein the rearward end of each said bonding pad is oval-shaped and is electrically connected between said forward end and a conductor extending along said planar surface.

12. The printed circuit board as recited in claim 7, wherein the rearward end comprises an upper surface upon which a paste of solder is placed.

13. A bonding pad comprising:

a forward portion extending coplanar with a rearward portion, said forward portion is V-shaped having a pair of protrusions extending coplanar with said forward and rearward portions in a divergent pattern from an apex point at a forward-facing side of said rearward portion; and a solder mask material placed over said forward portion to present an upper smoothing surface at a non-abrupt angle, wherein said upper smoothing surface is adapted to receive a conductive pin, and to channel said conductive pin in an upward direction toward said apex and upon said rearward portion.

14. The bonding pad as recited in claim 13, wherein said rearward portion is adapted to receive a paste of solder.

15. The bonding pad as recited in claim 13, wherein said forward and rearward portions comprise a metal.

16. The bonding pad as recited in claim 13, wherein said solder mask material comprises an insulative material which is substantially resistant to adherence of solder thereto.

* * * * *